US010998440B2

(12) United States Patent
Karda et al.

(10) Patent No.: US 10,998,440 B2
(45) Date of Patent: May 4, 2021

(54) DEVICE INCLUDING A VERTICAL TRANSISTOR HAVING A LARGE BAND GAP CHANNEL MATERIAL AND VOID SPACES ADJACENT GATE ELECTRODES, AND RELATED METHODS AND SYSTEMS

(71) Applicant: Micron Technology, Inc., Boise, ID (US)

(72) Inventors: Kamal M. Karda, Boise, ID (US); Ramanathan Gandhi, Boise, ID (US); Hong Li, Boise, ID (US); Haitao Liu, Boise, ID (US); Durai Vishak Nirmal Ramaswamy, Boise, ID (US); Sanh D. Tang, Kuna, ID (US); Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/596,407

(22) Filed: Oct. 8, 2019

(65) Prior Publication Data

US 2020/0111907 A1 Apr. 9, 2020

Related U.S. Application Data

(60) Provisional application No. 62/743,139, filed on Oct. 9, 2018.

(51) Int. Cl.
*H01L 29/78* (2006.01)
*H01L 29/423* (2006.01)
*H01L 29/66* (2006.01)

(52) U.S. Cl.
CPC .... *H01L 29/7827* (2013.01); *H01L 29/42372* (2013.01); *H01L 29/66969* (2013.01)

(58) Field of Classification Search
CPC .......... H01L 29/7827; H01L 29/42372; H01L 29/66969; H01L 29/78642
See application file for complete search history.

(56) References Cited

U.S. PATENT DOCUMENTS 5,940,151 A 8/1999 Ha
7,105,934 B2 9/2006 Anderson et al.
(Continued)

FOREIGN PATENT DOCUMENTS

KR 10-1368191 B1 2/2014
WO 2018/063308 A1 4/2018

OTHER PUBLICATIONS

Billah et al. TCAD Simulation of Dual-Gate a-IGZO TFTs With Source and Drain Offsets, IEEE Electron Device Letters, vol. 37, No. 11, (Nov. 2016), pp. 1442-1445.
(Continued)

*Primary Examiner* — Mushfique Siddique
(74) *Attorney, Agent, or Firm* — TraskBritt (57) ABSTRACT

A device comprises a vertical transistor. The vertical transistor comprises a semiconductive pillar, at least one gate electrode, a gate dielectric material, and void spaces. The semiconductive pillar comprises a source region, a drain region, and a channel region extending vertically between the source region and the drain region, the channel region comprising a semiconductive material having a band gap greater than 1.65 electronvolts. The at least one gate electrode laterally neighbors the semiconductive pillar. The gate dielectric material is laterally between the semiconductive pillar and the at least one gate electrode. The void spaces are vertically adjacent the gate dielectric material and laterally intervening between the at least one gate electrode and each
(Continued)

of the source region and the drain region of the semiconductive pillar. Related electronic systems and methods are also disclosed.

22 Claims, 3 Drawing Sheets

(56) References Cited

U.S. PATENT DOCUMENTS

| | | | |
|---|---|---|---|
| 8,299,516 | B2 | 10/2012 | Weng et al. |
| 8,895,979 | B2 | 11/2014 | Chang et al. |
| 9,082,793 | B1 | 7/2015 | Ahmed |
| 9,230,985 | B1* | 1/2016 | Wu .................. H01L 29/66742 |
| 9,246,013 | B2 | 1/2016 | Ahmed |
| 9,397,145 | B1 | 7/2016 | Sills et al. |
| 9,443,982 | B1* | 9/2016 | Balakrishnan .... H01L 29/66772 |
| 9,773,888 | B2 | 9/2017 | Pulugurtha et al. |
| 2006/0278910 | A1 | 12/2006 | Forbes |
| 2015/0243748 | A1* | 8/2015 | Pulugurtha ....... H01L 27/10876 257/330 |
| 2015/0255619 | A1 | 9/2015 | Shimabukuro |
| 2016/0027804 | A1 | 1/2016 | Li et al. |
| 2016/0079385 | A1 | 3/2016 | Ellinger et al. |
| 2017/0077230 | A1* | 3/2017 | Ikeda ............... H01L 27/11582 |
| 2017/0141230 | A1 | 5/2017 | Ikeda et al. |
| 2018/0090679 | A1 | 3/2018 | Sills et al. |
| 2019/0172927 | A1* | 6/2019 | Jagannathan ....... H01L 29/6653 |
| 2020/0083245 | A1* | 3/2020 | Fayrushin .......... H01L 29/7926 |
| 2020/0111920 | A1* | 4/2020 | Sills .................. H01L 29/66969 |

OTHER PUBLICATIONS

Liu et al., Highly Flexible Electronics from Scalable Vertical Thin Film Transistors, Nano Letters, vol. 14, (2014), pp. 1413-1418.

Petti et al., Flexible Quasi-Vertical In—Ga—Zn—O Thin-Film Transistor With 300-nm Channel Length, vol. 36, No. 5, (May 2015), pp. 475-477.

Yoon et al., Effects of Deposition Temperature on the Device Characteristics of Oxide Thin-Film Transistors Using In—Ga—Zn—O Active Channels Prepared by Atomic-Layer, Applied Materials &Interfaces, vol. 9, (2017), pp. 22676-22684.

Zheng et al., All-Sputtered, Flexible, Bottom-Gate IGZO/Al2O3 Bi-Layer Thin Film Transistors on PEN Fabricated by a Fully Room Temperature Process, Journals of Materials Chemistry C, vol. 5, (2017), pp. 7043-7050.

International Search Report from International Application No. PCT/US2019/055055, dated Jan. 29, 2020, 3 pages.

International Written Opinion from International Application No. PCT/US2019/055055, dated Jan. 29, 2020, 4 pages.

* cited by examiner

DEVICE INCLUDING A VERTICAL TRANSISTOR HAVING A LARGE BAND GAP CHANNEL MATERIAL AND VOID SPACES ADJACENT GATE ELECTRODES, AND RELATED METHODS AND SYSTEMS

CROSS-REFERENCE TO RELATED APPLICATION

This application claims the benefit under 35 U.S.C. § 119(e) of U.S. Provisional Patent Application Ser. No. 62/743,139, filed Oct. 9, 2018, the disclosure of which is hereby incorporated herein in its entirety by this reference.

TECHNICAL FIELD

Embodiments of the disclosure relate to the field of semiconductor device design and fabrication. More specifically, embodiments disclosed herein relate to semiconductor device structures including vertical transistors having a volume substantially free of material extending between a semiconductive pillar and a gate electrode, and to related semiconductor devices, electronic systems, and methods.

BACKGROUND

Memory devices are generally provided as internal integrated circuits in computers or other electronic devices. There are many types of memory including, but not limited to, random-access memory (RAM), read-only memory (ROM), dynamic random access memory (DRAM), synchronous dynamic random access memory (SDRAM), Flash memory, and resistance variable memory. Non-limiting examples of resistance variable memory include resistive random access memory (ReRAM), conductive bridge random access memory (conductive bridge RAM), magnetic random access memory (MRAM), phase change material (PCM) memory, phase change random access memory (PCRAM), spin-torque-transfer random access memory (STTRAM), oxygen vacancy-based memory, and programmable conductor memory.

A typical memory cell of a memory device includes at least one access device, such as a transistor, and at least one memory storage structure, such as a capacitor. Modern applications for semiconductor devices can employ significant quantities of memory cells, arranged in memory arrays exhibiting rows and columns of the memory cells. The storage element may, for example, include a capacitor (e.g., sometimes referred to as a "cell capacitor" or a "storage capacitor") configured to store a logical state (e.g., a binary value of either a "0" or a "1") defined by the storage charge in the capacitor. The transistor may be referred to in the art as an "access transistor." The transistor conventionally includes a channel region between a pair of source/drain regions and further includes a gate configured to electrically connect the source/drain regions to one another through the channel region. The channel region conventionally includes a semiconductor material, such as silicon.

To charge, discharge, read, or recharge the capacitor, the transistor may be selectively turned to an "on" state, in which current flows between the source and drain regions through the channel region of the transistor. The transistor may be selectively turned to an "off" state, in which the flow of current is substantially stopped. In the "off" state, it is desired for the capacitor to retain the charge, without change. However, capacitors of conventional volatile memory cells may exhibit discharges of current over time and a resulting loss in stored charge. Therefore, even in the "off" state when the memory cell is unselected, current may flow from the capacitor. This off-state leakage current is referred to in the art as a sub-threshold leakage current.

A continuing goal of the semiconductor industry has been to increase the memory density (e.g., the number of memory cells per memory die) of memory devices. While a footprint of the memory devices of memory cells, including transistors, continue to be scaled down to increase the memory density, decreasing the size of one or more components of memory cells may negatively affect performance. For example, for a conventional transistor including a channel region formed of a conventional semiconductor material (e.g., silicon, polysilicon), reducing a thickness of a gate dielectric material between the channel region and a gate electrode can initially decrease the off current ($I_{OFF}$) of the transistor, but a limit in the minimum thickness of the gate dielectric material is reached at which the off current begins to undesirably increase due to band-to-band tunneling and the relatively low band gap of the conventional semiconductor materials. Accordingly, as scaling down occurs and the size of the transistor structures is reduced, improved techniques for fabricating densely packed memory cells that do not negatively affect performance, such as switching speed, would be desirable.

DETAILED DESCRIPTION

The illustrations included herewith are not meant to be actual views of any particular systems, semiconductor structures, or semiconductor devices, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device structure or a complete description of a process flow for fabricating a semiconductor device. The structures described below do not form complete semiconductor device structures, or systems for processing semiconductor device structures. Only those process acts and structures necessary to understand the embodiments described herein are described in detail below. Additional acts to form a complete semiconductor device structure or a system for processing a semiconductor device structure may be performed by conventional techniques.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, even at least 99.9% met, or even 100.0% met.

As used herein, the term "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

Figure 1A:
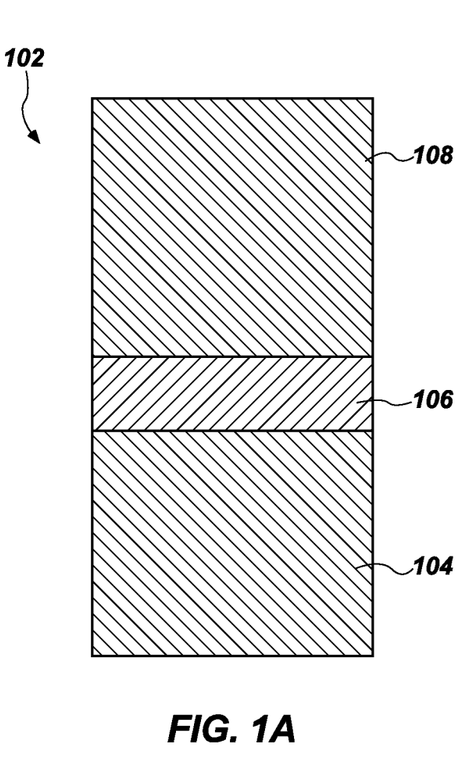
FIGS. 1A-1E are simplified cross-sectional views illustrating various stages of a method of fabricating a semiconductor device structure, in accordance with embodiments of the disclosure.
Figure 1B:
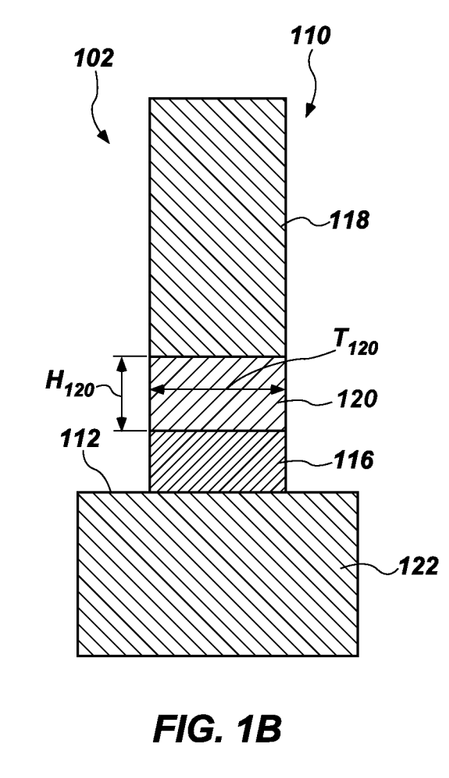
Figure 1C:
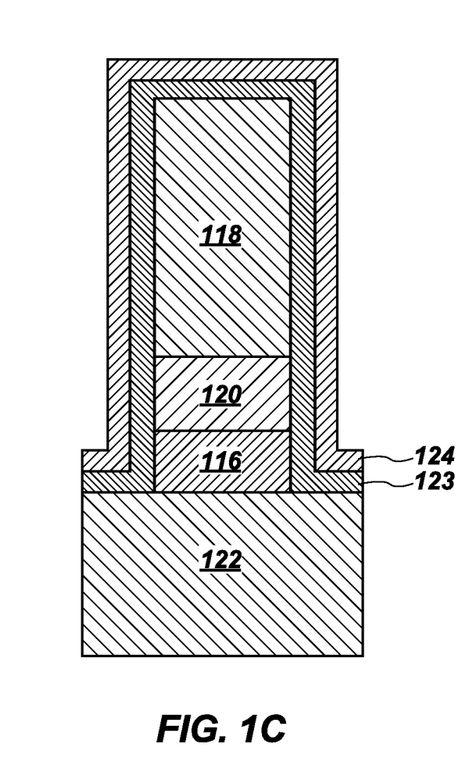
Figure 1D:
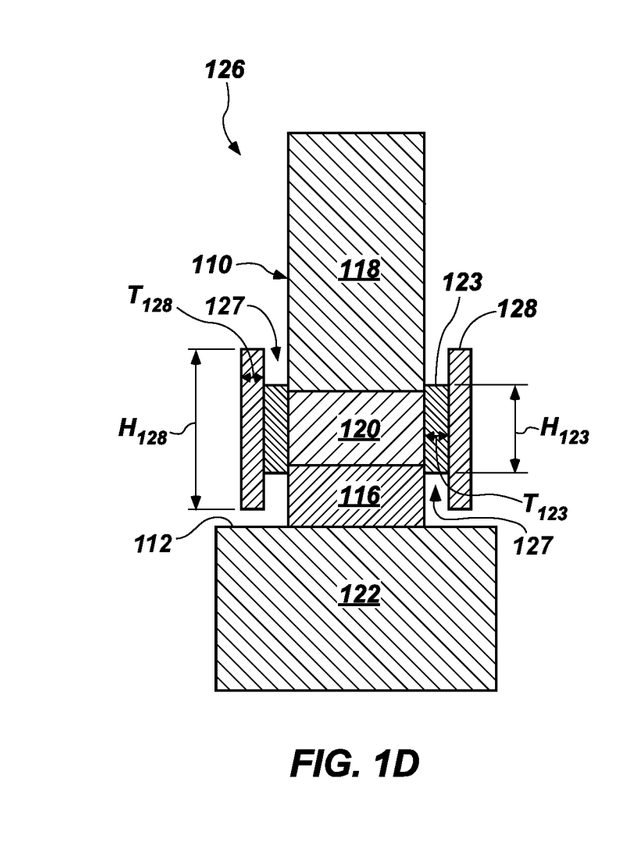
Figure 1E:
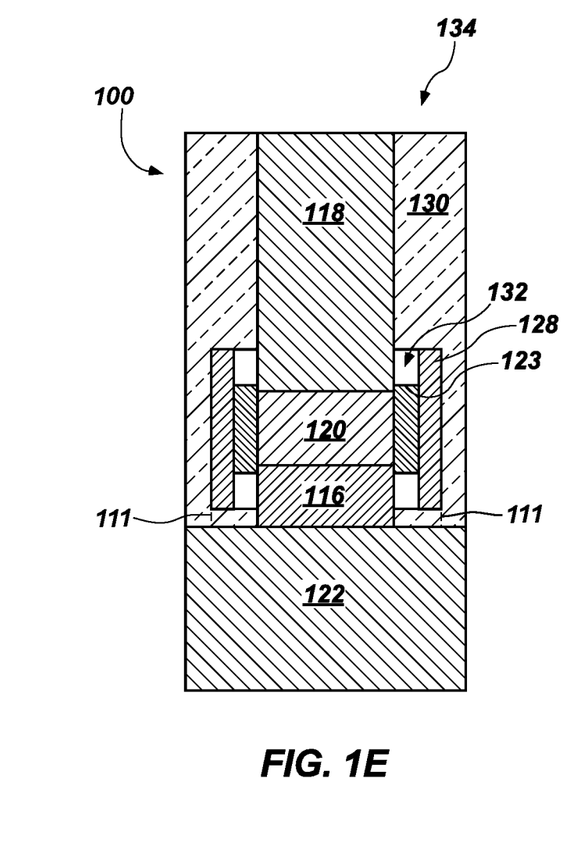

FIGS. 1A through 1E illustrate a method of fabricating a semiconductor device structure 100 (FIG. 1E). FIG. 1A illustrates a stack 102 of materials including an electrically conductive material 104, a semiconductor material 106 on the electrically conductive material 104, and another electrically conductive material 108 on the semiconductor material 106.

Referring next to FIG. 1B, at least a portion of the stack 102 may be subject to at least one material removal process (e.g., at least one etching process) to form a semiconductive pillar 110 comprising a drain region 116, a source region 118, and a channel region 120 (FIG. 1C) extending vertically between the drain region 116 and the source region 118. The drain region 116 may comprise a remaining (e.g., unremoved) portion of the electrically conductive material 104 (FIG. 1A), the source region 118 may comprise a remaining portion of the electrically conductive material 108 (FIG. 1A), and the channel region 120 may comprise a remaining portion of the semiconductor material 106. In addition, as shown in FIG. 1B, a digit line 122 (e.g., data line, bit line) may comprise another remaining portion of the electrically conductive material 104. In additional embodiments, the digit line 122 is not formed from the electrically conductive material 104 (FIG. 1A). For example, the electrically conductive material 104 (FIG. 1A) may be formed on or over the digit line 122, such that the electrically conductive material 104 is used (e.g., deposited, etched) to form the drain region 116 but not the digit line 122. The semiconductive pillar 110 may extend substantially perpendicular to an upper surface 112 of the digit line 122.

The semiconductor material 106 may comprise a material configured to conduct current responsive to application of a suitable voltage (e.g., a threshold voltage, a set bias voltage, a read bias voltage) to the vertical transistor 126 (FIG. 1D). The semiconductor material 106, for example, may comprise a semiconductive material having a larger band gap than polycrystalline silicon, such as a band gap greater than 1.65 electronvolts (eV). Having a larger band gap than polycrystalline silicon may decrease the off-state leakage current (e.g., sub-threshold leakage current) of a vertical transistor including the semiconductor material 106. For example, the semiconductor material 106 may comprise an oxide semiconductor material, such as zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_x$-$Ga_ySi_zO_a$, commonly referred to as "IGSO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), indium zinc oxide ($In_xZn_yO$), indium gallium zinc oxide ($In_xGa_yZn_zO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), zinc tin oxide ($Zn_xSn_yO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), indium gallium silicon oxide ($In_xGa_ySi_zO$), or a similar material. Formulae including at least one of "x," "y," "z," and "a" above (e.g., $Zn_xSn_yO$, $In_xZn_yO$, $In_xGa_yZn_zO$, $In_xGa_ySi_zO$, $Al_xSn_yIn_zZn_aO$) represent a composite material that contains an average ratio of "x" atoms of one element, "y" atoms of another element (if any), "z" atoms of an additional element (if any), and "d" atoms of a further element (if any) for every one atom of oxygen (O). As the formulae are representative of relative atomic ratios and not strict chemical structure, the semiconductor material 106 may comprise a stoichiometric compound or a non-stoichiometric compound, and values of "x,"

"y," "z," and "a" may be integers or may be non-integers. As used herein, the term "non-stoichiometric compound" means and includes a chemical compound with an elemental composition that cannot be represented by a ratio of well-defined natural numbers and is in violation of the law of definite proportions. In other embodiments, the semiconductor material 106 may comprise a chalcogen-based material. As used herein, the term "chalcogen" refers to an element of Group VI of the Periodic Table, such as oxygen (O), sulfur (S), selenium (Se), or tellurium (Te). By way of non-limiting example, chalcogen-based materials for the semiconductor material may include As and Te compounds, such as $As_2Te_3$; As and Se compounds, such as $As_2Se_3$; As, Te, and Ge compounds, such as $As_{30}Te_{45}Ge_{25}$; As, Se, and Ge compounds, such as $As_{28}Se_{42}Ge_{30}$; As, S, Se, and Ge compounds, such as $As_{30}S_{12}Se_{33}Ge_{25}$; and As, Te, Ge, Si, In compounds, such as $As_{37}Te_{39}Ge_9Si_{14}In$. In yet further embodiments, the semiconductor material 106 may comprise a Group III-V semiconductive material, which refers to semiconductive compounds of elements of Group III and Group V of the Period Table, including, but not limited to, GaAs, GaP, and GaN. The semiconductor material 106 may be dopant free (e.g., undoped).

The electrically conductive material 104 and the another electrically conductive material 108 may each individually comprise a metallic material, such as, for example, tungsten, titanium, nickel, platinum, rhodium, ruthenium, aluminum, copper, molybdenum, iridium, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof.

With continued reference to FIG. 1B, the channel region 120 of the semiconductive pillar 110 may be formed to a thickness $T_{120}$ (e.g., lateral dimension) and to a height $H_{120}$ (e.g., vertical dimension). The height $H_{120}$ may extend in a range of from about 300 Å to about 2000 Å, in a range of from about 500 Å to about 1500 Å, or in a range of from about 300 Å to about 500 Å. The thickness $T_{120}$ may extend in a range from about 500 Å to about 2000 Å, or in a range of from about 1000 Å to about 2000 Å. The height $H_{120}$ of the channel region 120 may be less than a conventional semiconductive channel region (e.g., a conventional polysilicon channel region) of a conventional device. The relatively larger band gap of the semiconductor material (e.g., oxide semiconductor material) of the channel region 120 (as compared to conventional semiconductor materials), facilitates decreasing the height $H_{120}$ of the channel region 120 (e.g., decreasing the distance between the drain region 116 and the source region 118), while increasing the on current (ION) and maintaining (or even improving) off current ($I_{OFF}$) relative to conventional devices.

Referring next to FIG. 1C, a gate dielectric material 123 may be formed (e.g., conformally formed) over surfaces (e.g., upper surfaces, lateral surfaces) of the semiconductive pillar 110. A gate electrode material 124 may be formed (e.g., conformally formed) over at least a portion of the gate dielectric material 123. The gate dielectric material 123 and the gate electrode material 124 may be formed by, for example, atomic layer deposition (ALD), chemical vapor deposition (CVD), physical vapor deposition (PVD), low pressure chemical vapor deposition (LPCVD), plasma-enhanced chemical vapor deposition (PECVD), another deposition method, or combinations thereof.

The gate dielectric material 123 may comprise an electrically insulative material, such as phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), another gate dielectric material, a dielectric carbon nitride material (e.g., silicon carbon nitride (SiCN)), a dielectric carboxynitride material (e.g., silicon carboxynitride (SiOCN)), another material, or combinations thereof.

The gate electrode material 124 may include an electrically conductive material, such as, for example, tungsten, titanium, nickel, platinum, ruthenium, aluminum, copper, molybdenum, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), elemental titanium (Ti), elemental platinum (Pt), elemental rhodium (Rh), elemental ruthenium (Ru), elemental molybdenum (Mo), elemental iridium (Ir), iridium oxide ($IrO_x$), ruthenium oxide ($RuO_x$), elemental tungsten (W), elemental aluminum (Al), elemental copper (Cu), elemental gold (Au), elemental silver (Ag), polysilicon, alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the gate electrode material 124 comprises an electrically conductive metallic material.

Referring next to FIG. 1D, a portion of each of the gate dielectric material 123 and the gate electrode material 124 may be subjected to at least one material removal process (e.g., patterned) to form a vertical transistor 126 including the semiconductive pillar 110, the gate dielectric material 123, and gate electrodes 128. The gate dielectric material 123 and the gate electrode material 124 may be patterned using conventional processes (e.g., chemical mechanical planarization processes, wet etching processes, dry etching processes), which are not described in detail herein. As shown in FIG. 1D, the gate dielectric material 123 is patterned such that a portion of the gate dielectric material 123 remains between the channel region 120 of the semiconductive pillar 110 and the gate electrodes 128. The gate dielectric material 123 may be formed such that the gate dielectric material 123 has a height $H_{123}$ (e.g., vertical dimension) and a thickness $T_{123}$ (e.g., lateral dimension), and the gate electrode 128 may be formed such that the gate electrode 128 has a thickness $T_{128}$ (e.g., lateral dimension) and a height $H_{128}$ (e.g., vertical dimension).

The thickness $T_{123}$ of the gate dielectric material 123 may be selected based upon the composition of the semiconductive material of the channel region 120 and/or based upon the height $H_{120}$ of the channel region 120. The thickness $T_{123}$ of the gate dielectric material 123 may be tailored to achieve desirable electrical properties for the vertical transistor 126 in operation, such as, for example, a desirable driving voltage (e.g., from an access line driver) to switch the vertical transistor 126 into the "on" state. Here, the thickness $T_{123}$ of the gate dielectric material 123 may be less than a thickness of a gate dielectric material of conventional devices because the gate dielectric material 123 of the vertical transistor 126 (which includes the channel region 120 comprising a relatively larger band gap) does not exhibit the undesirable off current behavior exhibited by many conventional devices (e.g., devices including conventional channel region configurations, such as channel regions having relatively lower band gap) as a result of band-to-band tunneling. The thickness $T_{123}$ of the gate dielectric material 123 may be formed to extend within a range of from about 10 Å to about 100 Å, such as from about 20 Å to about 50 Å, or from about 10 Å to about 20 Å.

The thickness $T_{128}$ of the gate electrode 128 may extend in a range from about 30 Å to about 150 Å, and may be about 90 Å. The height $H_{128}$ of the gate electrodes 128 may extend in a range from about 100 Å to about 1000 Å, and may be about 650 Å. The thickness $T_{128}$ and the height $H_{128}$ of the gate electrodes 128 may be selected at least partially based on desired resistivity properties for the gate electrodes 128, as described in further detail below.

The gate dielectric material 123 may be patterned such that the height $H_{123}$ is less than the height $H_{128}$ of the gate electrodes 128. In some embodiments, a ratio of the height $H_{123}$ of the gate dielectric material 123 to the height $H_{128}$ of the gate electrodes 128 is within a range of from about 1:2 to about 1:10, such as about 1:3. The height $H_{123}$ of the gate dielectric material 123 may be selected at least partially based on desired dimensions of void spaces between the gate electrodes 128 and the semiconductive pillar 110, as described in further detail below.

As the height $H_{123}$ of the gate dielectric material 123 is less than the height $H_{128}$ of the gate electrodes 128, portions of volumes 127 extending between the semiconductive pillar 110 and each of the gate electrodes 128 are substantially free of material. The portions of each volume 127 substantially free of material may comprise a first portion extending vertically above the gate dielectric material 123 and a second portion extending vertically below the gate dielectric material 123. The first portion of the volume 127 may extend vertically between an upper vertical boundary of the gate electrode 128 and an upper surface of the gate dielectric material 123. In addition, the first portion of the volume 127 may extend laterally between an outer lateral surface of the semiconductive pillar 110 and an inner lateral surface of the gate electrode 128 that faces (e.g., opposes) the outer lateral surface of the semiconductive pillar 110. The second portion of the volume 127 may extend vertically between a lower surface of the gate dielectric material 123 and the upper surface 112 of the digit line 122. The second portion of the volume 127 may extend laterally between the outer lateral surface of the semiconductive pillar 110 and the inner lateral surface of the gate electrode 128.

The height $H_{128}$ and/or the thickness $T_{128}$ of each of the gate electrodes 128 may be selected to obtain desirable electrical properties of the vertical transistor 126 in operation. The resistance of the gate electrodes 128 can affect the switching speed of the vertical transistor 126 in operation. For example, decreasing the resistance of the gate electrodes 128 while also decreasing the capacitance of the vertical transistor 126 (e.g., by way of void spaces between the gate electrodes 128 and the semiconductive pillar 110, as described in further detail below) can reduce the switching speed of the vertical transistor 126. The resistance of each gate electrode 128 may be decreased by increasing the volume of the gate electrode 128. Accordingly, the resistance of each gate electrode 128 may be reduced by increasing the height $H_{128}$ and/or the thickness $T_{128}$ of the gate electrode 128.

However, increasing the height $H_{128}$ of the gate electrode 128 increases the overlap of the gate electrode 128 with the drain and source regions 116, 118 of the semiconductive pillar 110, and may, thus, increase so-called "overlap capacitance." Increasing the overlap capacitance may increase the overall capacitance of the vertical transistor 126. To decrease the capacitance of the vertical transistor 126, an insulating region may be formed between the gate electrode 128 and the drain and source regions 116, 118, as described with reference to FIG. 1E.

Referring next to FIG. 1E, a dielectric material 130 may be formed (e.g., non-conformally deposited) over portions of the gate electrodes 128 and the semiconductive pillar 110 to form a semiconductor device structure 134. The dielectric material 130 may be formed such that the portions of the volume 127 substantially free of material extending between the semiconductive pillar 110 and the gate electrodes 128 remain substantially free of material and form void spaces 132.

Some void spaces 132 may extend vertically above the gate dielectric material 123, and other void spaces 132 may extend vertically below the gate dielectric material 123. Void spaces 132 extending vertically above the gate dielectric material 123 may extend vertically between the upper vertical boundary of the gate electrode 128 and the upper surface of the gate dielectric material 123, and may extend laterally between the outer lateral surface of the semiconductive pillar 110 and the inner lateral surface of the gate electrode 128. For example, the void spaces 132 extending vertically above the gate dielectric material 123 may extend laterally between the gate electrodes 128 and the source region 118 of the semiconductive pillar 110. In some embodiments, void spaces 132 extending vertically below the gate dielectric material 123 extend vertically between the lower vertical boundary of the gate electrode 128 and the lower surface of the gate dielectric material 123. In such embodiments, the dielectric material 130 may extend over the upper surface 112 of the digit line 122 and define a lower vertical boundary of the void spaces 132 extending vertically below the gate dielectric material 123. In other embodiments, void spaces 132 extending vertically below the gate dielectric material 123 extend vertically between the upper surface 112 of the digit line 122 and the lower surface of the gate dielectric material 123. In such embodiments, dielectric material 130 may not extend laterally between the outer, lateral surface of the semiconductive pillar 110 and the inner lateral surface of the gate electrode 128, as indicated by the dashed line 111 in FIG. 1E. Void spaces 132 extending vertically below the gate dielectric material 123 may extend laterally between the outer lateral surface of the semiconductive pillar 110 and the inner lateral surface of the gate electrode 128. For example, the void spaces 132 extending vertically below the gate dielectric material 123 may extend laterally between the gate electrodes 128 and the drain region 116 of the semiconductive pillar 110.

As previously stated, the height $H_{123}$ of the gate dielectric material 123 may be selected such that the void spaces 132 have a height $H_{132}$ sufficient to effectively reduce overall capacitance between the drain and source regions 116, 118 and the gate electrodes 128. The height $H_{123}$ of the gate dielectric material 123 may be selected such that the respective upper and lower void spaces 132 may be selected at least partially based on desired dimensions of void spaces 132 between the gate electrodes 128 and the semiconductive pillar 110, as described in further detail below. In some embodiments, the height $H_{132}$ may be in a range extending from about 100 Å to about 450 Å.

The void spaces 132 electrically insulate each of the drain region 116 and the source region 118 from the gate electrodes 128 of the vertical transistor 126. As previously discussed, insulating each of the drain region 116 and the source region 118 from the gate electrodes 128 reduces overlap capacitance and, accordingly, the overall capacitance of the vertical transistor 126. In addition to resistance, capacitance of the vertical transistor 126 determines the maximum speed at which a semiconductor device comprising the vertical transistor 126 can operate. More specifically, the lower the capacitance, the faster the semiconductive device can operate. Accordingly, a semiconductor device (e.g., a memory device) comprising the vertical transistor 126 of the disclosure may operate at faster speeds at conventional driving voltages (e.g., about 3 V) than a conventional semiconductor device not including the vertical transistor 126 of the disclosure.

In use and operation, an individual vertical transistor 126 within an array may be accessed by applying a voltage through a row associated with the vertical transistor 126, and applying a voltage associated with a column of the vertical transistor 126 (e.g., via, for example, a source line associated with, for example, the source region 118). To access a particular vertical transistor 126, a voltage may be provided to the gate electrode 128 associated with the vertical transistor 126. Responsive to a sufficient voltage (e.g., a voltage having a magnitude greater than a threshold voltage), a current may flow in the channel region 120 between the source region 118 and the drain region 116 in an "on" state. Accordingly, the memory material in the capacitor may be accessed through the vertical transistor 126 responsive to exposing the gate electrode 128 to the threshold voltage.

In additional embodiments, the relatively larger band gap of the semiconductor material (e.g., oxide semiconductor material) of the channel region 120 (as compared to conventional semiconductor materials) and decreasing the height $H_{120}$ of the channel region 120, effectuates a decrease in the voltage (e.g., driving voltage) required to switch the vertical transistor 126 to an "on" state while maintaining a resistance and capacitance of the vertical transistor 126 relative to conventional devices. In such embodiments, the vertical transistor 126 is configured to switch to an "on" state upon application of a voltage less than about 3 V to the at least one gate electrode 128. In some embodiments, the vertical transistor 126 is configured to switch to an "on" state upon application of a voltage of less than about 2 V, a voltage in a range from about 1 V and 2 V, or a voltage less than or equal to about 1.9 V. In yet further embodiments, the relatively larger band gap of the semiconductor material (e.g., oxide semiconductor material) of the channel region 120 (as compared to conventional semiconductor materials) and decreasing the height $H_{120}$ of the channel region 120 may effectuates a decrease in the voltage required to switch the vertical transistor 126 relative to conventional devices, while the dimensions of the gate dielectric material 123 and the gate electrodes 128 may be configured to reduce the effective resistance and capacitance of the vertical transistor 126 relative to conventional devices as described herein.

Overall, memory cells, including vertical transistors 126, may be decreased in size by decreasing the size of one or more components of the vertical transistor 126 while positively affecting performance thereof. As previously discussed, the channel region 120 comprising high band gap materials has a reduced height $H_{120}$ relative to a channel region of low band gap materials. Reducing the height $H_{120}$ provides for a corresponding reduction of the height $H_{128}$ of the gate electrodes 128. While the height $H_{128}$ of the gate electrodes 128 may be reduced relative to conventional devices, the height $H_{128}$ of the gate electrodes 128 is greater than the height $H_{120}$ of the channel region 120 to decrease the resistance of the gate electrodes 128. In some embodiments, a ratio of height $H_{120}$ of the channel region 120 to the height $H_{128}$ of the gate electrodes 128 is greater than or equal to 1:2. The increased relative height $H_{128}$ of the gate electrodes 128 relative to the height $H_{120}$ of the channel region 120 may increase the capacitance of the vertical transistor 126. Accordingly, the void space 132 is provided between the drain and source regions 116, 118 and the gate electrodes 128 to reduce the capacitance of the vertical transistor 126. In view of the foregoing, the effective resistance and capacitance of the vertical transistor 126 according to embodiments of the present disclosure may be reduced by about 20% compared to conventional devices, resulting in relatively increased switching speed.

Thus, in accordance with embodiments of the disclosure, a device comprises a vertical transistor. The vertical transistor comprises a semiconductive pillar, at least one gate electrode, a gate dielectric material, and void spaces. The semiconductive pillar comprises a source region, a drain region, and a channel region extending vertically between the source region and the drain region, the channel region comprising a semiconductive material having a band gap greater than 1.65 electronvolts. The at least one gate electrode laterally neighbors the semiconductive pillar. The gate dielectric material is laterally between the semiconductive pillar and the at least one gate electrode. The void spaces are vertically adjacent the gate dielectric material and laterally intervening between the at least one gate electrode and each of the source region and the drain region of the semiconductive pillar.

Furthermore, in accordance with embodiments of the disclosure, a method of fabricating a device comprises forming a stack comprising a first electrically conductive material, a semiconductive material having a band gap greater than 1.65 electronvolts on the first electrically conductive material, and a second electrically conductive material on the semiconductive material. The first electrically conductive material, the semiconductive material, and the second electrically conductive material are patterned to form a semiconductive pillar comprising a drain region, a channel region, and a source region. Each of a gate dielectric material and a gate electrode material is formed over the semiconductive pillar, the gate dielectric material intervening between the gate electrode material and the semiconductive pillar. Portions of the gate dielectric material and the gate electrode material are removed to form a gate dielectric structure and a gate electrode, void spaces located vertically adjacent the gate dielectric structure and laterally intervening between the gate electrode and each of the source region and the drain region of the semiconductive pillar.

Moreover, in accordance with embodiments of the disclosure, a method of operating a memory device comprises applying a voltage of less than or equal to about 1.9 V to a gate electrode to switch a vertical transistor from an "off" state to an "on" state. The vertical transistor comprises a pillar structure, the gate electrode, a gate dielectric material, and void spaces. The pillar structure comprises a channel region extending vertically between a source region and a drain region, the channel region comprising an oxide semiconductor material. The gate electrode laterally neighbors the pillar structure. The gate dielectric material is laterally between the pillar structure and the gate electrode. The void spaces are vertically adjacent the gate dielectric material and laterally intervene between the gate electrode and each of the source region and the drain region of the pillar structure.

Figure 2:
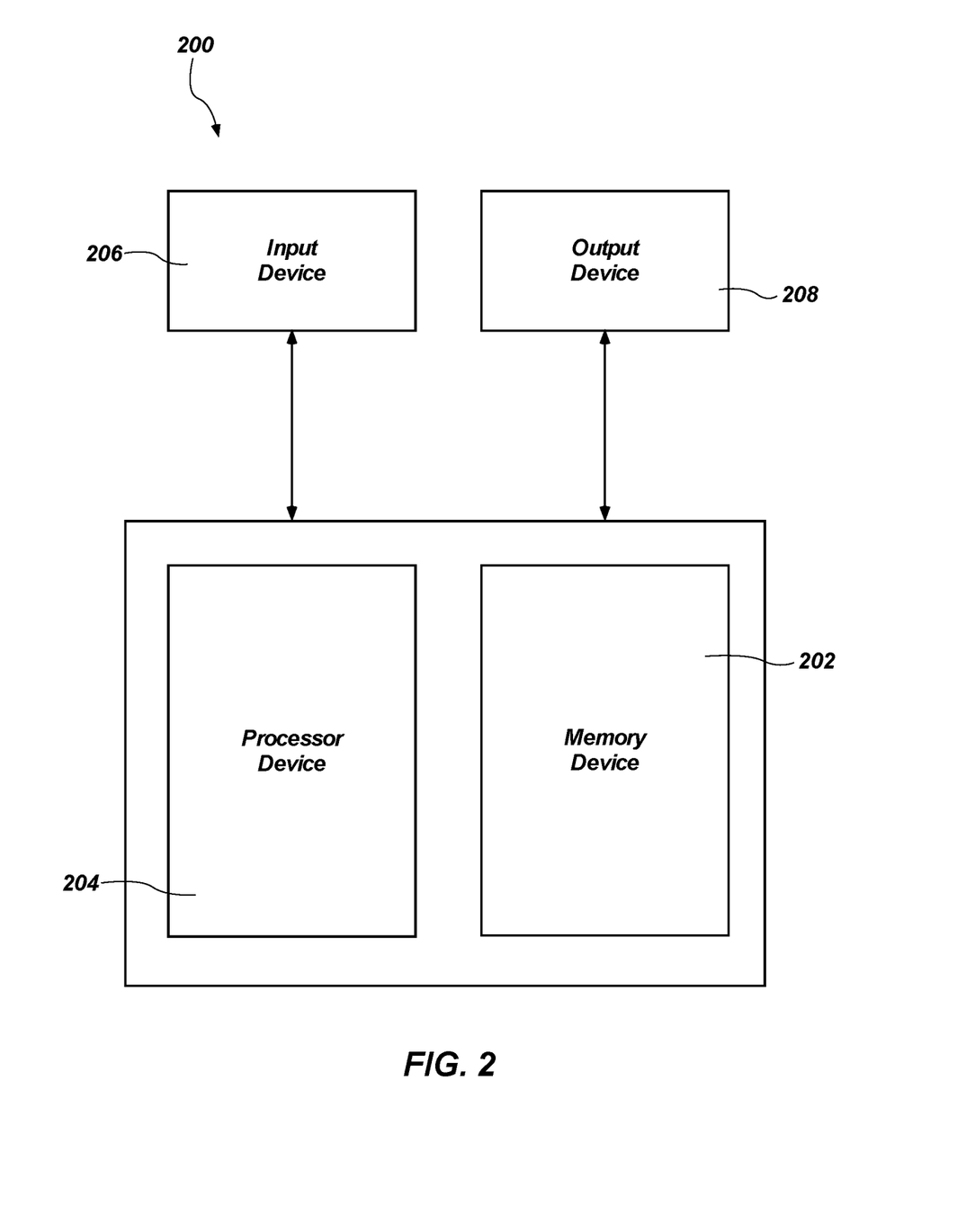
FIG. 2 is a schematic block diagram illustrating an electronic system, in accordance with embodiments of the disclosure.

Semiconductor devices (e.g., the semiconductor device structure 134 previously described with reference to FIG. 1E) including semiconductor device structures (e.g., the structure 100 previously described with reference to FIGS. 1A-1E) in accordance with embodiments of the disclosure may be used in embodiments of electronic systems of the disclosure. For example, FIG. 2 is a block diagram of an illustrative electronic system 200 according to embodiments of disclosure. The electronic system 200 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 200 includes at least one memory device 202. The at least one memory device 202 may include, for example, an embodiment of semiconductor device structures (e.g., the structures 100 previously described with reference to FIGS. 1A-1E). The electronic system 200 may further include at least one electronic signal processor device 204 (often referred to as a "microprocessor"). The electronic system 200 may further include one or more input devices 206 for inputting information into the electronic system 200 by a user, such as, for example, a mouse or other pointing device, a keyboard, a touchpad, a button, or a control panel. The electronic system 200 may further include one or more output devices 208 for outputting information (e.g., visual or audio output) to a user such as, for example, a monitor, a display, a printer, an audio output jack, a speaker, etc. In some embodiments, the input device 206 and the output device 208 may comprise a single touchscreen device that can be used both to input information to the electronic system 200 and to output visual information to a user. The one or more input devices 206 and output devices 208 may communicate electrically with at least one of the memory device 202 and the electronic signal processor device 204.

Thus, in accordance with embodiments of the disclosure, an electronic system comprises an input device, an output device, a processor device operably coupled to the input device and the output device, and a memory device operably coupled to the processor device. The memory device comprises at least one vertical transistor comprising a pillar structure, a dielectric material, a gate electrode, and void spaces. The pillar structure comprises a channel region vertically between a source region and a drain region. The channel region comprises a semiconductive material having a band gap greater than 1.65 electronvolts. The dielectric material is laterally adjacent the channel region of the pillar structure. The gate electrode is laterally adjacent the dielectric material and having a height larger than that of the channel region of the pillar structure. The void spaces laterally intervene between the gate electrode and portions of the pillar structure.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A device comprising:
a vertical transistor, comprising:
  a semiconductive pillar comprising:
    a source region;
    a drain region; and
    a channel region extending vertically between the source region and the drain region, the channel region comprising a semiconductive material having a band gap greater than 1.65 electronvolts;
  at least one gate electrode laterally neighboring the semiconductive pillar;
  a gate dielectric material laterally between the semiconductive pillar and the at least one gate electrode, a thickness of the gate dielectric material within a range from about 10 Å to about 100 Å; and
  void spaces vertically adjacent the gate dielectric material and laterally intervening between the at least one gate electrode and each of the source region and the drain region of the semiconductive pillar.

2. The device of claim 1, wherein the gate dielectric material extends laterally between the channel region of the semiconductive pillar and the at least one gate electrode.

3. The device of claim 1, wherein a ratio of a height of the gate dielectric material to a height of the at least one gate electrode is within a range of from about 1:2 to about 1:10.

4. The device of claim 1, wherein a height of the channel region is within a range from about 300 Å to about 2000 Å.

5. The device of claim 1, wherein a ratio of a height of the channel region to a height of the at least one gate electrode is greater than 1:2.

6. The device of claim 1, wherein the channel region comprises one or more of ZTO, $ZnO_x$, IGSO, $InO_x$, $In_2O_3$, $SnO_2$, $TiO_x$, $Zn_xO_yN_z$, $Mg_xZn_yO_z$, $In_xZn_yO_z$, $In_xGa_yZn_zO_a$, $Zr_xIn_yZn_zO_a$, $Hf_xIn_yZn_zO_a$, $Sn_xIn_yZn_zO_a$, $Al_xSn_yIn_zZn_aO_d$, $Si_xIn_yZn_zO_a$, $Zn_xSn_yO_z$, $Al_xZn_ySn_zO_a$, $Ga_xZn_ySn_zO_a$, $Zr_xZn_ySn_zO_a$, and InGaSiO.

7. The device of claim 1, wherein the channel region comprises a chalcogen-based material.

8. The device of claim 1, wherein the semiconductive material of the channel region is dopant free.

9. The device of claim 1, wherein the thickness of the gate dielectric material is within a range from about 20 Å to about 50 Å.

10. A device, comprising:
a vertical transistor, comprising:
  a semiconductive pillar comprising:
    a source region;
    a drain region; and
    a channel region extending vertically between the source region and the drain region, the channel region comprising a semiconductive material having a band gap greater than 1.65 electronvolts;
  at least one gate electrode laterally neighboring the semiconductive pillar;
  a gate dielectric material laterally between the semiconductive pillar and the at least one gate electrode, a ratio of a height of the gate dielectric material to a height of the at least one gate electrode being about 1:3; and
  void spaces vertically adjacent the gate dielectric material and laterally intervening between the at least one gate electrode and each of the source region and the drain region of the semiconductive pillar.

11. The device of claim 1, wherein the void spaces comprise:
- a first void space vertically above a portion of the gate dielectric material and laterally intervening between the source region and the at least one gate electrode; and
- a second void space vertically below another portion of gate dielectric material and laterally intervening between the drain region and the at least one gate electrode.

12. The device of claim 10, wherein each of the void spaces has a height within a range from about 100 Å to about 450 Å.

13. A device, comprising:
- a vertical transistor configured to switch to an "on" state upon application of a voltage of less than 3 V to the at least one gate electrode, the vertical transistor comprising:
  - a semiconductive pillar comprising:
    - a source region;
    - a drain region; and
    - a channel region extending vertically between the source region and the drain region, the channel region comprising a semiconductive material having a band gap greater than 1.65 electronvolts;
  - at least one gate electrode laterally neighboring the semiconductive pillar;
  - a gate dielectric material laterally between the semiconductive pillar and the at least one gate electrode; and
  - void spaces vertically adjacent the gate dielectric material and laterally intervening between the at least one gate electrode and each of the source region and the drain region of the semiconductive pillar.

14. The device of claim 13, wherein the vertical transistor is configured to switch to the "on" state upon application of a voltage of less than or equal to about 1.9 V to the at least one gate electrode.

15. An electronic system comprising:
- an input device;
- an output device;
- a processor device operably coupled to the input device and the output device; and
- a memory device operably coupled to the processor device and comprising:
  - a digit line; and
  - at least one vertical transistor vertically overlying the digit line and comprising:
    - a pillar structure comprising a channel region vertically between a source region and a drain region, the channel region comprising a semiconductive material having a band gap greater than 1.65 electronvolts;
    - a dielectric material laterally adjacent the channel region of the pillar structure;
    - a gate electrode laterally adjacent the dielectric material and having a height larger than that of the channel region of the pillar structure; and
    - void spaces laterally intervening between the gate electrode and portions of the pillar structure, the void spaces comprising:
      - a first void space vertically above a portion of the dielectric material and laterally intervening between the source region and the gate electrode; and
      - a second void space vertically below the portion of the dielectric material and an upper surface of the digit line, the second void space laterally intervening between the drain region and the gate electrode.

16. The electronic system of claim 15, wherein the second void space extends vertically between the portion of dielectric material and another portion of the dielectric material overlying the upper surface of the digit line.

17. The electronic system of claim 15, wherein the at least one vertical transistor is configured to operate in an "on" state at a threshold voltage of 1.9 V.

18. A method of fabricating a device comprising:
- forming a stack comprising a first electrically conductive material, a semiconductive material having a band gap greater than 1.65 electronvolts on the first electrically conductive material, and a second electrically conductive material on the semiconductive material;
- patterning the first electrically conductive material, the semiconductive material, and the second electrically conductive material to form a semiconductive pillar comprising a drain region, a channel region, and a source region;
- forming each of a gate dielectric material and a gate electrode material over the semiconductive pillar, the gate dielectric material intervening between the gate electrode material and the semiconductive pillar and having a thickness within a range from about 10 Å to about 100 Å; and
- removing portions of the gate dielectric material and a gate electrode material to form a gate dielectric structure and a gate electrode, void spaces located vertically adjacent the gate dielectric structure and laterally intervening between the gate electrode and each of the source region and the drain region of the semiconductive pillar.

19. The method of claim 18, further comprising selecting the semiconductive material to comprise an oxide semiconductor material.

20. The method of claim 19, wherein selecting the semiconductive material to comprise an oxide semiconductor material comprises selecting the semiconductive material to comprise one or more of $Zn_xSn_yO$, $In_xZn_yO$, $Zn_xO$, $In_xGa_yZn_zO$, $In_xGa_ySi_zO_a$, $In_xO$, $Sn_xO$, $Ti_xO$, $Zn_xON_z$, $Mg_xZn_yO$, $Zr_xIn_yZn_zO$, $Hf_xIn_yZn_zO$, $Sn_xIn_yZn_zO$, $Al_xSn_yIn_zZn_aO$, $Si_xIn_yZn_zO$, $Al_xZn_ySn_zO$, $Ga_xZn_ySn_zO$, $Zr_xZn_ySn_zO$, and $In_xGa_ySi_zO$.

21. The method of claim 19, wherein removing portions of the gate dielectric material and the gate electrode material to form the gate dielectric structure and the gate electrode comprises forming the gate dielectric structure and the gate electrode such that a ratio of the height of the gate dielectric structure to the height of the gate electrode is within a range of from about 1:2 to about 1:10.

22. A method of operating a memory device, comprising:
- applying a voltage of less than or equal to about 1.9 V to a gate electrode to switch a vertical transistor from an "off" state to an "on" state, the vertical transistor comprising:
  - a pillar structure comprising a channel region extending vertically between a source region and a drain region, the channel region comprising an oxide semiconductor material;
  - the gate electrode laterally neighboring the pillar structure;
  - a gate dielectric material laterally between the pillar structure and the gate electrode, a thickness of the gate dielectric material within a range from about 10 Å to about 100 Å; and void spaces vertically adjacent the gate dielectric material and laterally intervening between the gate electrode and each of the source region and the drain region of the pillar structure.

* * * * *